United States Patent
Chung

(10) Patent No.: US 8,803,592 B2
(45) Date of Patent: Aug. 12, 2014

(54) DATA PERSISTENCE CONTROL APPARATUS FOR RFID TAG

(71) Applicant: LSIS Co., Ltd., Anyang-si (KR)

(72) Inventor: Chel Ho Chung, Anyang-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 0 days.

(21) Appl. No.: 13/927,620

(22) Filed: Jun. 26, 2013

(65) Prior Publication Data
US 2014/0028352 A1   Jan. 30, 2014

(30) Foreign Application Priority Data
Jul. 26, 2012   (KR) .................. 10-2012-0082040

(51) Int. Cl.
*G05F 1/10* (2006.01)
(52) U.S. Cl.
USPC .......................................... 327/537
(58) Field of Classification Search
CPC ...................................... G05F 3/205
USPC .......................................... 327/537
See application file for complete search history.

(56) References Cited

U.S. PATENT DOCUMENTS

2005/0237843 A1* 10/2005 Hyde ........................... 365/228
2008/0180219 A1   7/2008 Fischer et al.

FOREIGN PATENT DOCUMENTS

KR   20100086432   7/2010

OTHER PUBLICATIONS

Korean Intellectual Property Office Application Serial No. 10-2012-0082040, Office Action dated Jul. 29, 2013, 4 pages.
European Patent Office Application U.S. Appl. No. 1375518.3, Search Report dated Dec. 2, 2013, 8 pages.

* cited by examiner

*Primary Examiner* — Daniel Rojas
(74) *Attorney, Agent, or Firm* — Lee, Hong, Degerman, Kang & Waimey

(57) ABSTRACT

A data persistence control apparatus for an RFID tag is provided. The apparatus includes a capacitor to be charged, a charge circuit to charge the capacitor, a discharge circuit to discharge the capacitor, a switch switched on to electrically connect the charge circuit to the capacitor or the discharge circuit to the capacitor, and an output circuit to output a logic high signal or a logic low signal according to an input voltage determined based on a discharged degree of the capacitor.

14 Claims, 3 Drawing Sheets

FIG. 1

| FLAD | REQUIRED PERSISTENCE |
|---|---|
| S0 INVENTORIED FLAG | TAG ENERGIZED: INDEFINITE<br>TAG NOT ENERIZED: NONE |
| S1 INVENTORIED FLAG[1] | TAG ENERGIED:<br>  NOMINAL TEMPERATURE RANGE:500ms < PERSISTENCE < 5s<br>  EXTENDED TEMPERATURE RANGE: NOT SPECIFIED<br>TAG NOT ENERGIZED:<br>  NOMINAL TEMPERATURE RANGE: 500ms < PERSISTENCE < 5s<br>  EXTENDED TEMPERATURE RANGE: NOT SPECIFIED |
| S2 INVENTORIED FLAG[1] | TAG ENERGIZED: INDEFINITE<br>TAG NOT ENERGIZED:<br>  NOMINAL TEMPERATURE RANGE: 2s < PERSISTENCE<br>  EXTENDED TEMPERATURE RANGE: NOT SPECIFIED |
| S3 INVENTORIED FLAG[1] | TAG ENERGIZED: INDEFINITE<br>TAG NOT ENERGIZED:<br>  NOMINAL TEMPERATURE RANGE: 2s < PERSISTENCE<br>  EXTENDED TEMPERATURE RANGE: NOT SPECIFIED |
| SELECTED (SL) FLAG[1] | TAG ENERGIZED: INDEFINITE<br>TAG NOT ENERGIZED:<br>  NOMINAL TEMPERATURE RANGE: 2s < PERSISTENCE<br>  EXTENDED TEMPERATURE RANGE: NOT SPECIFIED |

DATA PERSISTENCE CONTROL APPARATUS FOR RFID TAG

CROSS-REFERENCE TO RELATED APPLICATION

Pursuant to 35 U.S.C. §119(a), this application claims the benefit of earlier filing date and right of priority to Korean Application No. 10-2012-0082040, filed on Jul. 26, 2012, the contents of which is incorporated by reference herein in its entirety.

BACKGROUND OF THE DISCLOSURE

1. Field of the Disclosure

This specification relates to a radio frequency identification (RFID) tag, and particularly, to a data persistence control apparatus for an RFID tag based on a flag technology.

2. Background of the Disclosure

Radio frequency identification (RFID) is a type of wireless (radio) communication scheme. The RFID has been developed for the purpose of transmitting and receiving a small amount of identification data via radio frequency signals. RFID technologies have been divided according to characteristics of applications to be applied.

The RFID technologies may be divided into an RFID technology using a high frequency band and an RFID technology using an ultrahigh frequency band according to frequency bands used. The RFID technologies may also be classified into a passive type, a semi-active type and an active type according to whether it is self-powered or not.

A communication units may generally be divided into a reader and a tag.

The reader may perform transmission and reception of the Radio Frequency (abbreviated as RF hereinafter) signal with the tag for reading information of the tag.

The tag may transmit stored information to the reader by modulating phase, amplitude or the like when the RF signal is received.

There is no unified international organization for regulating RFID technologies. Independent regulation and standards are subject to each nation which uses the RFID technology.

International standards for RFID technologies may include ISO/IEC, DASH 7, EPG global and the like, and be variously classified according to frequencies to be used for communications and usage purposes.

A flag technology of RFID-related technologies is a technology which is generally associated with a function of retaining (maintaining) response state information of a tag for a predetermined time when a communication distance between the reader and the tag is more than a predetermined distance, especially, when a plurality of tags are located within a radius of a communication-available distance of the reader. Here, the response state information of the tag refers to information indicating that tag which have already responded and transferred information to the reader, among a plurality of tags existing within an operating radius of the reader, selectively react with respect to a response request signal, sent by the reader, by retaining the tag response state as a predetermined value.

The flag technology is an essential technology when one reader reads a plurality of tags or when a plurality of readers read a plurality of tags. The associated description will be found in EPC global standards and the like.

Korean Publication Patent No. 10-2009-0073546, as the related art associated with the flag technology, discloses a data persistence (retention) control apparatus for an RFID tag. Here, a data storage unit and an amplification circuit play a role of a memory cell of a dynamic random access memory (DRAM). However, data loss is caused regardless of whether or not an electric power is supplied or after a predetermined time since power supplied. A data storage element which executes data storage is not required.

Also, the Publication Patent (10-2009-0073546) discloses that a capacity of a capacitor has to increase to extend a data persistence time. The increase in the capacity of the capacitor may cause an increase in an area of a semiconductor chip so as to generate extra costs. This may also cause electric power consumption, irrespective of operations relating to the flag technology.

U.S. Pat. No. 7,215,251 as another related art, discloses that a comparator is used as a component for implementing the flag technology. However, the comparator requires a constant current source which causes a continuous current consumption. With the continuous consumption of the constant current while the comparator is used, electric power loss may be caused.

SUMMARY OF THE DISCLOSURE

Therefore, an aspect of the present disclosure is to provide a data persistence control apparatus for an RFID tag, capable of satisfying a flag operation criteria based on EPC global standards and minimizing electric power consumption.

Another aspect of the present disclosure is to provide a data persistence control apparatus for an RFID tag, capable of satisfying a flag operation criteria based on EPC global standards, reducing complexity of circuits, and reducing costs owing to smaller areas of components.

Another aspect of the present disclosure is to provide a data persistence control apparatus for an RFID tag, capable of preventing an unnecessary current leakage by using a switch upon both charging and discharging of a capacitor.

To achieve these and other advantages and in accordance with the purpose of this specification, as embodied and broadly described herein, there is provided a data persistence control apparatus for an RFID tag comprising:

a capacitor to be charged;

a charge circuit that charges the capacitor;

a discharge circuit that discharges the capacitor;

a switch that electrically connects the charge circuit to the capacitor or the discharge circuit to the capacitor when the switch is on state; and an output circuit that outputs a logic high signal or a logic low signal according to an input voltage determined based on a discharged degree of the capacitor.

In accordance with one aspect of the present disclosure, the output circuit is configured to output the logic high signal when the determined input voltage is lower than a threshold voltage in response to discharging of the capacitor.

In accordance with another aspect of the present disclosure, the output circuit may output the logic low signal when the determined input voltage is higher than a threshold voltage in response to charging of the capacitor.

In accordance with another aspect of the present disclosure, the threshold voltage may be 220 mV, and the output circuit is configured to decide a persistence time of the logic high signal based on the threshold voltage.

In accordance with another aspect of the present disclosure, the output circuit comprises a plurality of NMOS (N-Metal Oxide Semiconductor) transistors and a plurality of PMOS (P-Metal Oxide Semiconductor) transistors.

In accordance with another aspect of the present disclosure, the switch electrically connects the charge circuit and the capacitor to each other when the capacitor is charged, and the switch electrically connects the discharge circuit and the capacitor to each other when the capacitor is discharged.

In accordance with another aspect of the present disclosure, the switch may be configured by an NMOS transistor.

In accordance with another aspect of the present disclosure, the apparatus may further include a control circuit to control operations of the charge circuit, the discharge circuit and the switch by receiving an input signal and an enable signal.

In accordance with another aspect of the present disclosure, the control circuit may control the charge circuit and the switch to be turned on when the enable signal is a logic high signal and the input signal is a logic high signal.

In accordance with another aspect of the present disclosure, the control circuit may control the discharge circuit and the switch to be turned on when the enable signal is a logic high signal and the input signal is a logic low signal.

In accordance with another aspect of the present disclosure, the control circuit comprises a first NOT gate connected to an input terminal of the input signal;
 a buffer connected to an input terminal of the enable signal;
 a first NAND gate that has a first input terminal connected to an output terminal of the first NOT gate and a second input terminal connected to an output terminal of the buffer;
 a second NAND gate that has a first input terminal connected to the output terminal of the buffer and a second input terminal connected to an input terminal of the input signal, the second NAND gate having an output terminal connected to the charge circuit; and
 a second NOT gate that has an input terminal connected to the output terminal of the first NAND gate and an output terminal connected to the discharge circuit.

In accordance with another aspect of the present disclosure, the charge circuit may be configured by a PMOS transistor, and the discharge circuit may be configured by an NMOS transistor.

In accordance with still another aspect of the present disclosure, there is provided a data persistence control apparatus for an RFID tag comprising:
 a capacitor to be charged;
 a charge circuit that charges the capacitor;
 a discharge circuit that discharges the capacitor;
 a switch that electrically connects the charge circuit to the capacitor or the discharge circuit to the capacitor when the switch is on state;
 an output circuit that outputs a logic high signal or a logic low signal according to an input voltage determined based on a discharged degree of the capacitor; and
 a control circuit that controls operations of the charge circuit, the discharge circuit and the switch by receiving an input signal and an enable signal,
 wherein the charge circuit is configured by a PMOS transistor,
 wherein the discharge circuit is configured by an NMOS transistor,
 wherein the switch is configured by an NMOS transistor,
 wherein a drain terminal of the charge circuit is connected to a drain terminal of the discharge circuit and a drain terminal of the switch,
 wherein a source terminal of the charge circuit is connected to a gate terminal of the switch and a first terminal of the control circuit,
 wherein a gate terminal of the charge circuit is connected to a second terminal of the control circuit,
 wherein a gate terminal of the discharge circuit is connected to a third terminal of the control circuit, and
 wherein a source terminal of the switch is connected to one terminal of the capacitor and an input terminal of the output circuit.

In accordance with still another aspect of the present disclosure, the control circuit is configured to turns on the switch when the enable signal is a logic high signal, irrespective of an input signal, to electrically connect the charge circuit to the capacitor or the discharge circuit to the capacitor.

Further scope of applicability of the present application will become more apparent from the present disclosure given hereinafter. However, it should be understood that the present disclosure and specific examples, while indicating preferred embodiments of the disclosure, are given by way of illustration only, since various changes and modifications within the spirit and scope of the disclosure will become apparent to those skilled in the art from the present disclosure.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings:

FIG. 1 is a table showing information related to an RFID flag technology specified in EPC global standards;

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

FIG. 1 is a table showing information related to an RFID flag technology specified in EPC global standards.

The table shown in FIG. 1 is excerpted from the EPC global generation 2 specification, and will be briefly described hereinafter.

Referring to FIG. 1, RFID flags may be classified totally into five flag functions. First of all, for a flag S0, a tag may always retain a preset value when the tag is energized (i.e. when an electric power is supplied to the tag), and execute no function when the tag is not energized (i.e. when an electric power is not supplied to the tag). Retaining the preset value may indicate a state that the tag has data (information), and executing no function may indicate a state that the tag does not have data (information).

That is, whether or not the tag retains the preset value may be determined according to whether or not the tag is energized. Whether or not the tag is energized is closely associated with an operation of a passive type tag. This is because an electric power required to operate circuits of the passive type tag is exclusively dependant on RF signal. In more detail, the tag operates by extracting direct current (abbreviated as DC hereinafter) electric energy (i.e., DC electric power) from energy of electric waves (i.e., the RF signal) supplied by the reader, without a battery.

Therefore, when such electric wave is not received from the reader or the tag is unable to generate the DC power due to a long distance between the tag and the reader, the supply of the electric power to the tag may be stopped.

Referring back to FIG. 1, for a flag S1, when the tag has a preset value, irrespective of whether or not the tag is energized, the tag has to retain the preset value from the moment for a duration of time in the range of 0.5 seconds to 5 seconds (i.e., 0.5 sec<persistence time<5 sec).

For flags S2 to SL, such flags have to retain the preset value while they are energized. Also, the flags should retain data for at least two seconds while they are not energized.

As such, the core of the flag technology is to retain data for a preset time and thereafter lose the information when the preset time elapses.

Hereinafter, description will be given of data persistence (retention) control apparatus for an RFID tag in accordance with one exemplary embodiment of the present disclosure, with reference to FIGS. 2 and 3.

Figure 2:
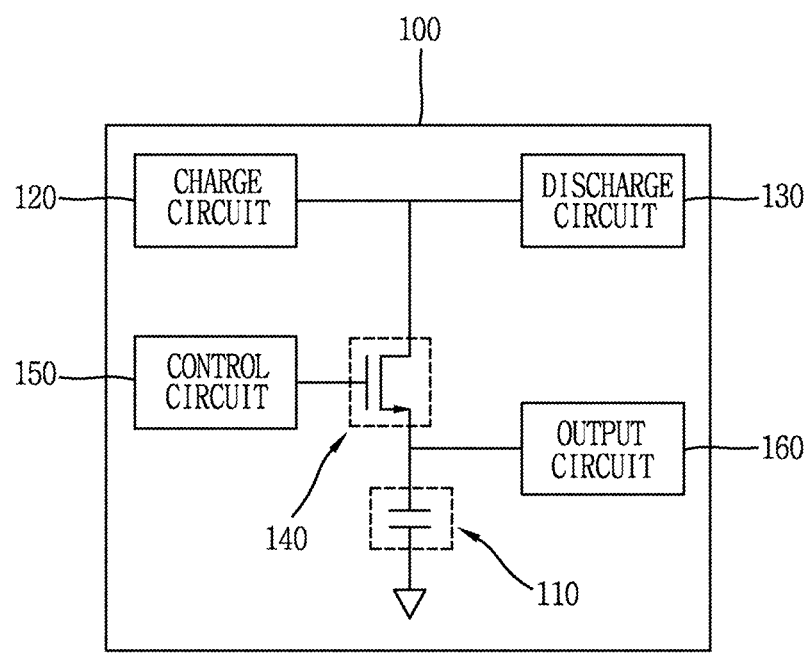
FIG. 2 is a block diagram of a data persistence (data retention) control apparatus for RFID flags in accordance with one exemplary embodiment of the present disclosure.
Figure 3:
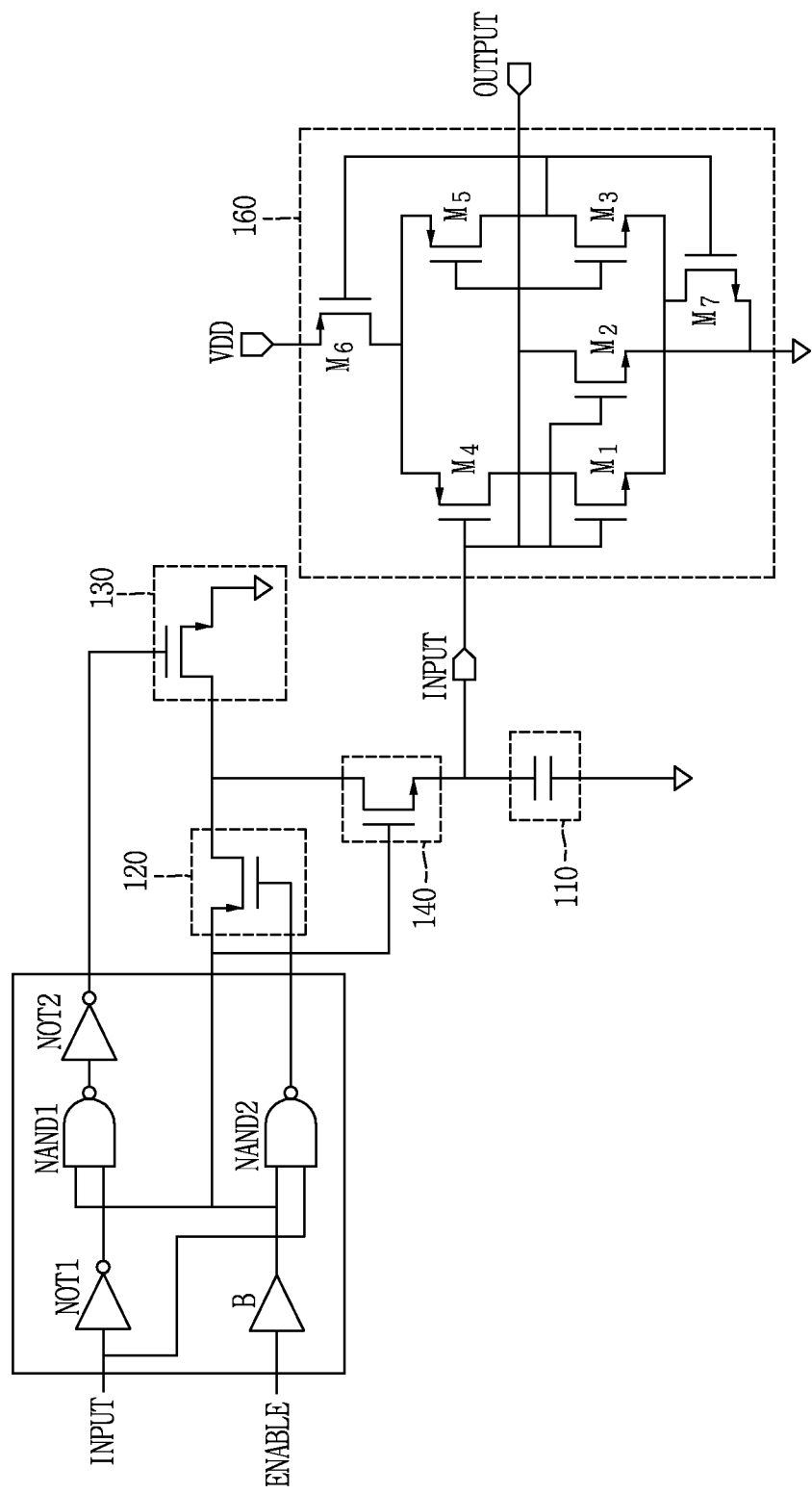
FIG. 3 is a detailed configuration view of the data persistence control apparatus for the RFID flags in accordance with the one exemplary embodiment of the present disclosure.

FIG. 2 is a block diagram of a data persistence control apparatus for an RFID tag in accordance with one exemplary embodiment, and FIG. 3 is a detailed configuration view of the data persistence control apparatus for the an RFID tag in accordance with the one exemplary embodiment.

First, referring to FIG. 2, a data persistence control apparatus for an RFID tag according to one exemplary embodiment of the present disclosure comprises a capacitor 110, a charge circuit 120, a discharge circuit 130, a switch 140, a control circuit 150, and an output circuit 160.

The charge circuit 120 may receive an electric power supplied. The charge circuit 120 may apply a voltage to the switch 140 by use of the supplied electric power to charge the capacitor 110 with electric charges. As shown in FIG. 3, the charge circuit 120 may be configured by a PMOS transistor.

The discharge circuit 130 may be turned on together with the switch 140 to discharge the electric charges charged in the capacitor 130. As shown in FIG. 3, the discharge circuit 130 may be configured by an NMOS transistor.

The switch 140 may be switched on when the capacitor 110 is charged with electric charges to connect the charge circuit 120 and the capacitor 110 to each other.

The switch 140 may be switched on when the capacitor 110 discharges electric charge to connect the discharge circuit 130 and the capacitor 110 to each other.

That is, when an enable signal is a logic high signal, the switch 140 may be switched on to electrically connect the charge circuit 120 and the capacitor 110 or between the discharge circuit 130 and the capacitor 110 during a charging or discharging operation.

Referring to FIG. 3, the switch 140 may be configured by an NMOS transistor.

A gate terminal of the switch 140 may be connected to a source terminal of the charge circuit 120, and a drain terminal of the switch 140 may be connected to a drain terminal of the discharge circuit 130.

A source terminal of the switch 140 may be connected to an input terminal of the output circuit 160 and one terminal of the capacitor.

The switch 140 may be used during both charging and discharging operations of the capacitor 110, thereby preventing an unnecessary leakage of current.

Referring back to FIG. 2, the control circuit 150 may receive an input signal and enable signal in a logic high or logic low state, to control operations of the charge circuit 120, the discharge circuit 130 and the switch 140. Here, the input signal and the enable signal may be provided by a controller (not shown) within a tag.

In more detail, the control circuit 150 may turn on or turn off the charge circuit 120, the discharge circuit 130 and the switch 140 according to the logic high or low state of the input signal and the enable signal from the controller.

Referring to FIG. 3, the control circuit 150 may include a buffer B, first and second NOT gates NOT1 and NOT2, and first and second NAND gates NAND1 and NAND2.

The first NOT gate NOT1 may be connected to an input terminal of the input signal.

The buffer B may be connected to an input terminal of the enable signal.

The first NAND gate NAND1 may have a first input terminal connected to an output terminal of the first NOT gate NOT1, and a second input terminal connected to an output terminal of the buffer B.

The second NAND gate NAND2 may have a first input terminal connected to an output terminal of the buffer B and a second input terminal connected to an input terminal of the input signal. An output terminal of the second NAND gate NAND2 may be connected to the charge circuit 120.

The second NOT gate NOT2 may have an input terminal connected to an output terminal of the first NAND gate NAND1, and an output terminal connected to the discharge circuit 130.

The input signal may be applied from the controller to the input terminal and the enable signal may be applied from the controller to the enabled terminal. The input signal may be a signal corresponding to S2 S3 and SL of the EPC global standards of FIG. 1.

When the enable signal is a logic low signal, the control circuit 150 may turn off the charge circuit 120, the discharge circuit 130 and the switch 140.

When the enable signal is a logic high signal, the control circuit 150 may turn on or off the charge circuit 120, the discharge circuit 130 and the switch 140 according to whether the input signal is either a logic high signal or a logic low signal.

When the enable signal is a logic high signal and the input signal is a logic high signal, the control circuit 150 may turn on the charge circuit 120 and the switch 140, and turn off the discharge circuit 130. Accordingly, the charge circuit 120 may charge the capacitor 110 with electric charges.

When the enable signal is a logic high signal and the input signal is a logic low signal, the control circuit 150 may turn on the discharge circuit 130 and the switch 140, and turn off the charge circuit 120. Accordingly, the discharge circuit 130 may connect the capacitor 110 to a ground so as to discharge the electric charge charged in the capacitor 110.

The output circuit 160 may output a logic high output signal or a logic low output signal according to whether or not an input voltage, which is determined based on a discharged degree of the capacitor 110, exceeds a turn-off voltage.

The output circuit 160 may maintain a latency time, which is a time taken until the input voltage becomes lower than the turn-off voltage, according to whether or not the input voltage exceeds the turn-off voltage. In accordance with one exemplary embodiment, the output circuit 160 may set the turn-off voltage to 200 mV which is lower than 450 mV, the conventional turn-off voltage, to extend the latency time. Here, the latency time may refer to a time for which the data persistence control apparatus 100 for the RFID tag retains information.

When the capacitor 110 is discharged, the output circuit 160 may output a logic high signal when the input voltage is gradually decreasing to be lower than the turn-off voltage.

When the capacitor 110 is charged, the output circuit 160 may output a logic low signal when the input voltage is gradually increasing to be higher than the turn-off voltage.

The logic-high signal or the logic-low signal output by the output circuit 160 may be used for deciding whether or not to stop the retention of the response state information (data) which the tag retains, or for deciding whether or not to transmit the response state data to the reader.

The turn-off voltage may be a reference voltage for the output circuit 160 to decide whether or not to output the logic high output signal or the logic low output signal.

Still referring to FIG. 3, the output circuit 160 may include a plurality of PMOS transistors and a plurality of NMOS transistors.

Especially, the output circuit 160 may further include an NMOS transistor M2 in addition to a well-known Schmitt trigger circuit.

When the input signal is the logic high signal and the enable signal is the logic high signal for a predetermined time (for a short time), it may correspond to the flag S2 shown in FIG. 1. Accordingly, the charge circuit 120 and the switch 140 may be turned on and the capacitor 110 may be charged. Here, the output signal of the output circuit 160 may be a logic low signal.

Since the enable signal has changed into the logic low state after persisting in the logic high state for a predetermined time (for a short time), the switch 140 may be switched off after the predetermined time.

A current of the capacitor 110 may gradually decrease due to a leakage current of the switch 140 and its own leakage current, accordingly, the input voltage of the output circuit 160 may gradually decrease.

The input voltage may be a voltage which is applied to the input terminal INPUT of the output circuit 160. When the input voltage is lower than the turn-off voltage of the output circuit 160, the output signal of the output circuit 160 may be in the logic high state. Hence, the output circuit 160 may implement the flag S2 shown in FIG. 1 for a time taken until the output signal of the output circuit 160 changes from the logic low state into the logic high state.

During operation as the flag S3 of FIG. 1, the enable signal may be the logic high signal while electric power is supplied. Since the enable signal changes into the logic low state, starting from a time point that the electric power supply to the data persistence control apparatus 100 for the RFID tag is stopped, the switch 140 may be turned off and the electric charges charged in the capacitor 110 may be leaked out.

Therefore, while the supply of power to the data persistence control apparatus 100 for the RFID tag is stopped, the input voltage of the output circuit 160 may continue to be lowered.

However, when power is resupplied to the data persistence control apparatus 100 for the RFID tag after being stopped for two seconds, the output circuit 160 may output a logic-high signal as the output signal when the input voltage is higher than the turn-off voltage. Accordingly, the RFID tag may retain the response state data, which has been maintained prior to stopping the electric power supply, even after the electric power is resupplied.

Since the output circuit 160 may consume an electric current only at the time point that the input voltage changes, continuous electric power consumption may not occur. This may result in reduction of electric power consumption.

As described above, the data persistence control apparatus 100 for the RFID tag according to the exemplary embodiment of the present disclosure can implement every flag technology based on the EPG global standards.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A data persistence control apparatus for an RFID tag, the apparatus comprising:
    a capacitor for storing electrical energy that retains a preset value when the RFID tag is powered on;
    a charge circuit for charging the capacitor;
    a discharge circuit for discharging the capacitor;
    a switch for electrically connecting either the charge circuit or the discharge circuit to the capacitor when the switch is in an on state;
    an output circuit for outputting a logic high signal or a logic low signal according to an input voltage that is determined based on a degree of discharge of the capacitor; and
    a control circuit for controlling the charge circuit, the discharge circuit and the switch by receiving an input signal and an enable signal, the control circuit comprising
    a first NOT gate for receiving the input signal;
    a buffer for receiving the enable signal;
    a first NAND gate that has a first input terminal connected to an output terminal of the first NOT gate and a second input terminal connected to an output terminal of the buffer;
    a second NAND gate that has a first input terminal connected to the output terminal of the buffer, a second input terminal connected to an input terminal of the first NOT gate and an output terminal connected to the charge circuit; and
    a second NOT gate that has an input terminal connected to the output terminal of the first NAND gate and an output terminal connected to the discharge circuit.

2. The data persistence control apparatus of claim 1, wherein the output circuit is configured to output the logic high signal when the input voltage is lower than a threshold voltage.

3. The data persistence control apparatus of claim 2, wherein:
    the threshold voltage is 220 mV; and
    the output circuit is further configured to determine a persistence time of the logic high signal based on the threshold voltage.

4. The data persistence control apparatus of claim 1, wherein the output circuit is configured to output the logic low signal when the input voltage is higher than a threshold voltage.

5. The data persistence control apparatus of claim 4, wherein the threshold voltage is 220 mV; and
    the output circuit is further configured to determine a persistence time of the logic high signal based on the threshold voltage.

6. The data persistence control apparatus of claim 1, wherein the output circuit comprises a plurality of NMOS transistors and a plurality of PMOS transistors.

7. The data persistence control apparatus of claim 6, wherein the switch is configured by an NMOS transistor.

8. The data persistence control apparatus of claim 1, wherein:
the switch electrically connects the charge circuit to the capacitor when the capacitor is charged; and
the switch electrically connects the discharge circuit to the capacitor to when the capacitor is discharged.

9. The data persistence control apparatus of claim 1, wherein the control circuit is configured to control the charge circuit and the switch to be turned on when the enable signal is high and the input signal is high.

10. The data persistence control apparatus of claim 9, wherein the control circuit is further configured to control the discharge circuit and the switch to be in the on state when the enable signal is high and the input signal is low.

11. The data persistence control apparatus of claim 1, wherein the control circuit is configured to control the discharge circuit and the switch to be in the on state when the enable signal is high and the input signal is low.

12. The data persistence control apparatus of claim 1, wherein:
the charge circuit is configured by a PMOS transistor; and
the discharge circuit is configured by an NMOS transistor.

13. The apparatus of claim 12, wherein the control circuit is configured to control the switch to be in the on state when the enable signal is high, irrespective of the input signal such that the charge circuit or the discharge circuit is electronically connected to the capacitor.

14. The data persistence control apparatus of claim 1, wherein the control circuit is further configured to control the switch to remain in the on state during charging and discharging of the capacitor.

* * * * *